US012695065B2

(12) United States Patent
Ishikawa et al.

(10) Patent No.: US 12,695,065 B2
(45) Date of Patent: Jul. 28, 2026

(54) PLASMA PROCESSING APPARATUS AND POTENTIAL CONTROL METHOD

(71) Applicant: Tokyo Electron Limited, Tokyo (JP)

(72) Inventors: Shinya Ishikawa, Miyagi (JP); Daiki Hariu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 677 days.

(21) Appl. No.: 18/080,645

(22) Filed: Dec. 13, 2022

(65) Prior Publication Data

US 2023/0187184 A1     Jun. 15, 2023

(30) Foreign Application Priority Data

Dec. 13, 2021     (JP) ................................. 2021-201751

(51) Int. Cl.
*H01J 37/32*          (2006.01)

(52) U.S. Cl.
CPC .. *H01J 37/32577* (2013.01); *H01J 37/32146* (2013.01); *H01J 37/32568* (2013.01); *H01J 37/32642* (2013.01); *H01J 37/32715* (2013.01); *H01J 2237/2007* (2013.01); *H01J 2237/334* (2013.01)

(58) Field of Classification Search
CPC .......... H01J 37/32577; H01J 37/32146; H01J 37/32568; H01J 37/32642; H01J 37/32715; H01J 2237/334; H01J 2237/2007; H01J 2237/332–3348
USPC .................... 156/345.1–345.55; 118/715–733
See application file for complete search history.

(56) References Cited

U.S. PATENT DOCUMENTS

| | | | | |
|---|---|---|---|---|
| 2010/0243606 | A1* | 9/2010 | Koshimizu | ....... H01J 37/32091 |
| | | | | 156/345.44 |
| 2011/0031217 | A1* | 2/2011 | Himori | ............. H01J 37/32091 |
| | | | | 156/345.48 |
| 2013/0288483 | A1* | 10/2013 | Sadjadi | ............. H01L 21/67248 |
| | | | | 438/758 |
| 2019/0267218 | A1* | 8/2019 | Wang | ................ H01L 21/67109 |
| 2020/0219701 | A1* | 7/2020 | Koshimizu | ....... H01J 37/32183 |
| 2020/0266088 | A1* | 8/2020 | Kosakai | ........... H01L 21/76826 |
| | | | (Continued) | |

FOREIGN PATENT DOCUMENTS

| | | |
|---|---|---|
| JP | 2017-130659 A | 7/2017 |
| JP | 2021-158134 A | 10/2021 |

*Primary Examiner* — Charlee J. C. Bennett
(74) *Attorney, Agent, or Firm* — XSENSUS LLP

(57) ABSTRACT

A plasma processing apparatus includes: a chamber; a bias power supply that generates an electric bias; a substrate support that supports a substrate and an edge ring in the chamber, and including a first region configured to hold the substrate, a second region provided to surround the first region and hold the edge ring, a first bias electrode provided in the first region to receive the electric bias, a first impedance adjusting electrode provided in the first region to be grounded, a second bias electrode provided in the second region to receive the electric bias, and a second impedance adjusting electrode provided in the second region to be grounded; an impedance adjusting mechanism connected to at least one of the first impedance adjusting electrode and the second impedance adjusting electrode; and an electric path connecting the bias power supply, the first bias electrode, and the second bias electrode.

17 Claims, 8 Drawing Sheets

(56) References Cited

U.S. PATENT DOCUMENTS

| | | | |
|---|---|---|---|
| 2020/0402777 A1* | 12/2020 | Sasaki | H01L 21/68721 |
| 2021/0305025 A1* | 9/2021 | Tamura | H01L 21/6833 |
| 2024/0420923 A1* | 12/2024 | Ishikawa | H01J 37/32568 |

* cited by examiner

70

71

72

73

FOR HIGH
FREQUENCY     FOR LOW
FREQUENCY

74

FOR HIGH
EFFICIENCY     FOR LOW
EFFICIENCY

PLASMA PROCESSING APPARATUS AND POTENTIAL CONTROL METHOD

CROSS-REFERENCE TO RELATED APPLICATIONS

This application claims priority to Japanese Patent Application No. 2021-201751, filed on Dec. 13, 2021, the entire contents of which are incorporated herein by reference.

TECHNICAL FIELD

The present disclosure relates to a plasma processing apparatus and a potential control method.

BACKGROUND

In a plasma processing apparatus, the thickness of a plasma sheath may vary depending on the potential difference between a substrate (hereinafter, also referred to as a wafer) and an edge ring. Therefore, the direction of an electric field is not vertical to the substrate, and the trajectories of ions are inclined, so that tilting occurs in which an etching hole is inclined obliquely. Further, in a case where an edge ring is eroded, it is proposed to increase a radio frequency (RF) voltage in the edge ring by adjusting a variable capacitor connected to an annular electrode disposed below the edge ring (Patent Document 1).

PRIOR ART DOCUMENTS

Patent Documents

Patent Document 1: JP-A-2017-130659

SUMMARY

The present disclosure provides a plasma processing apparatus and a potential control method capable of independently controlling a potential on a substrate side and an edge ring side.

According to an aspect of the present disclosure, a plasma processing apparatus includes a chamber; a bias power supply configured to generate an electric bias; a substrate support configured to support a substrate and an edge ring in the chamber, the substrate support including: a first region configured to hold the substrate; a second region provided to surround the first region and configured to hold the edge ring; a first bias electrode provided in the first region to receive the electric bias; a first impedance adjusting electrode provided in the first region and grounded; a second bias electrode provided in the second region to receive the electric bias; and a second impedance adjusting electrode provided in the second region and grounded; an impedance adjusting mechanism connected to at least one of the first impedance adjusting electrode and the second impedance adjusting electrode; and an electric path connecting the bias power supply, the first bias electrode, and the second bias electrode.

According to the present disclosure, a potential can be independently controlled on a substrate side and an edge ring side.

BRIEF DESCRIPTION OF THE DRAWINGS

FIG. 9 is a view illustrating an example of the connection of the impedance adjusting mechanism according to Modification 2.

DETAILED DESCRIPTION

Hereinafter, embodiments of a plasma processing apparatus and a potential control method disclosed herein will be described in detail with reference to the accompanying drawings. The disclosed technology is not limited to the following embodiments.

In order to suppress the tilting, driving of an edge ring and application of a direct current (DC) to the edge ring are conceivable; however, these need parts for performing a mechanical operation and a housing for applying the DC thereto. Therefore, there are problems such as an increase in occupation ratio of a space inside the plasma processing apparatus and an increase in design cost. Further, the tilting causes a problem of global tilting in which the position dependency of a plasma sheath appears in a radial direction and/or a circumferential direction on the entire surface of a wafer due to not only the potential difference between the wafer and the edge ring but also a potential difference generated by an electrode of a substrate support or subtle difference in thickness of a ceramic plate. Therefore, it is expected to independently control the potential on a wafer (substrate) side and an edge ring side.

[Configuration of Plasma Processing Apparatus 1]

Figure 1:
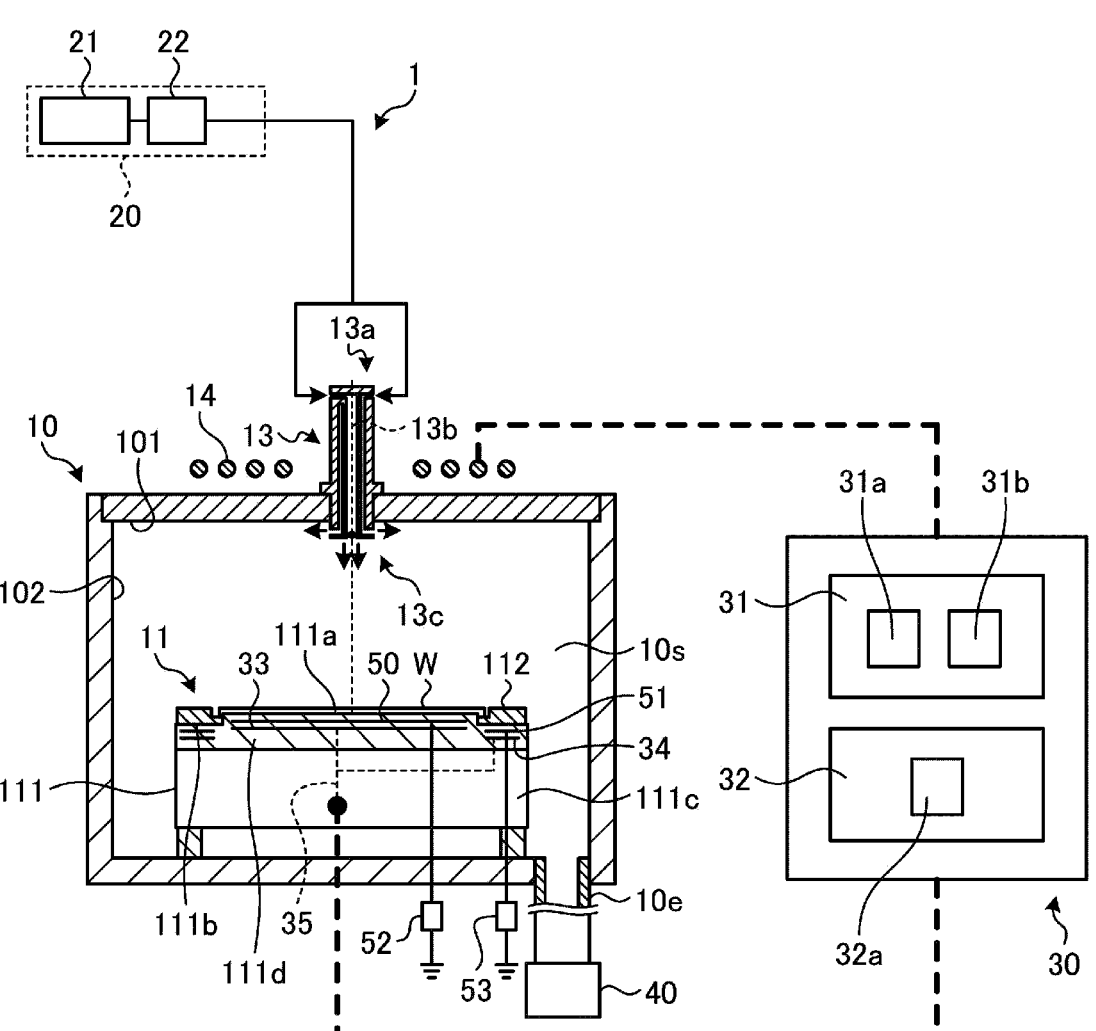
FIG. 1 is a view illustrating an example of a plasma processing apparatus according to one embodiment of the present disclosure.

Hereinafter, a configuration example of an inductively coupled plasma processing apparatus as an example of the plasma processing apparatus 1 will be described. FIG. 1 is a view illustrating an example of a plasma processing apparatus according to one embodiment of the present disclosure. As shown in FIG. 1, the inductively coupled plasma processing apparatus 1 is an inductively coupled plasma (ICP)-type plasma processing apparatus and includes a plasma processing chamber 10, a gas supply 20, a power source 30, and an exhaust system 40. The plasma processing chamber 10 includes a dielectric window 101. Further, the plasma processing apparatus 1 includes a substrate support 11, a gas introduction unit, and an antenna 14. The substrate support 11 is an example of a substrate support and is disposed in the plasma processing chamber 10. The antenna 14 is disposed on or above the plasma processing chamber 10 (that is, on or above the dielectric window 101). The plasma processing chamber 10 has a plasma processing space 10s defined by the dielectric window 101, the sidewall 102 of the plasma processing chamber 10, and the substrate support 11.

The substrate support 11 includes a main body 111 and a ring assembly 112. The main body 111 has a central region (substrate support surface) 111a for supporting the substrate (wafer) W, and an annular region (ring support surface) 111b for supporting the ring assembly 112. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. The central region 111a is an example of a first region, and the annular region 111b is an example of a second region.

In one embodiment, the main body 111 includes a base 111c and an electrostatic chuck 111d. The base 111c includes a conductive member. The conductive member of the base 111c functions as a part of an electric path 35 connected to a first bias electrode 33 and a second bias electrode 34, which will be described later. The electrostatic chuck 111d is disposed on the base 111c. The electrostatic chuck 111d has an attracting electrode (not illustrated). The upper surface of the electrostatic chuck 111d includes the substrate support surface 111a. The ring assembly 112 includes one or more annular members. At least one of the one or more annular members is an edge ring. Although not illustrated, the substrate support 11 may include a temperature control module configured to adjust at least one of the electrostatic chuck 111d, the ring assembly 112, and the substrate W to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111a.

The electrostatic chuck 111d includes a first impedance adjusting electrode 50 and a first bias electrode 33 in an order from a side of the substrate support surface 111a below the substrate support surface 111a, and is formed of a dielectric, for example, ceramic. Further, the electrostatic chuck 111d includes a second impedance adjusting electrode 51 and the second bias electrode 34 in the order from a side of the ring support surface 111b below the ring support surface 111b. The first bias electrode 33 and the second bias electrode 34 are connected to the base 111c with the conductive member to form the electric path 35. The connection of the base 111c to the first bias electrode 33 and the second bias electrode 34 is not limited to the conductive member, and, for example, may be based on any method capable of supplying a bias RF signal, such as magnetic resonance, electric field resonance, capacitive coupling, or inductive coupling. Further, the electric path 35 may be configured such that the second RF generator 31b which will be described later is not connected to the base 111c, and that the second RF generator 31b is directly connected to the first bias electrode 33 and the second bias electrode 34.

The first impedance adjusting electrode 50 is grounded through an impedance adjusting mechanism 52. The impedance adjusting mechanism 52 adjusts an amount of a portion of an RF signal (electric bias) d from the first bias electrode 33 to be flowed to the ground. The first impedance adjusting electrode 50 adjusts the amount of RF signal that flows to the ground to thus adjust the potential of the substrate W, to be used for control of a tilting angle or adjustment of an etching rate. The first impedance adjusting electrode 50 is disposed to be parallel to the first bias electrode 33.

The second impedance adjusting electrode 51 is grounded through an impedance adjusting mechanism 53. The impedance adjusting mechanism 53 adjusts the amount of the portion of the RF signal (electric bias) supplied from the second bias electrode 34 to be flowed to the ground. The second impedance adjusting electrode 51 adjusts the amount of the RF signal that flows to the ground to thus adjust the potential of the ring assembly 112, to be used for the control of the tilting angle or the adjustment of the etching rate. The second impedance adjusting electrode 51 is disposed to be parallel to the second bias electrode 34.

The first bias electrode 33 and the second bias electrode 34 are brought as close as possible to the substrate W and the ring assembly 112, so as to reduce the impedance of a capacitor to be configured by the substrate W, the ring assembly 112, the ceramic of the electrostatic chuck 111d, and the electrodes. As a result, the potential difference between the first bias electrode 33 and the second bias electrode 34, and the substrate W and the ring assembly 112 is reduced. Similarly, the impedance of a capacitor to be configured by the first bias electrode 33 and the second bias electrode 34, and the first impedance adjusting electrode 50 and the second impedance adjusting electrode 51 is also reduced. Further, the impedance of a capacitor to be configured by the first impedance adjusting electrode 50 and the second impedance adjusting electrode 51, and the substrate W and the ring assembly 112 is also reduced.

At least one of the impedance adjusting mechanisms 52 and 53 may be provided, or both of the impedance adjusting mechanisms 52 and 53 may be provided. When one of the impedance adjusting mechanisms 52 and 53 is not provided, the first impedance adjusting electrode 50 or the second impedance adjusting electrode 51 on a side where no impedance adjusting mechanism is provided is connected to the ground through impedance of a predetermined value, or is not connected to the ground to be in a floating state.

The gas introduction unit is configured to introduce at least one processing gas from the gas supply 20 into the plasma processing space 10s. In one embodiment, the gas introduction unit includes a center gas injector (CGI) 13. The center gas injector 13 is disposed above the substrate support 11 and attached to a center opening formed in the dielectric window 101. The center gas injector 13 has at least one gas supply port 13a, at least one gas flow path 13b, and at least one gas introduction port 13c. The processing gas supplied to the gas supply port 13a passes through the gas flow path 13b and is introduced into the plasma processing space 10s from the gas introduction port 13c. The gas introduction unit may include one or more side gas injectors (SGI) attached to one or more openings formed in the sidewall 102, in addition to or instead of the center gas injector 13.

The gas supply 20 may include at least one gas source 21 and at least one flow rate controller 22. In one embodiment, the gas supply 20 is configured to supply at least one processing gas from the respective corresponding gas sources 21 to the center gas introduction unit through the respective corresponding flow rate controllers 22. Each flow rate controller 22 may include, for example, a mass flow controller or a pressure-controlled flow rate controller. Further, the gas supply 20 may include at least one flow rate modulation device that modulates or pulses the flow rate of at least one processing gas.

The power source 30 includes an RF power source 31 coupled to plasma processing chamber 10 via at least one impedance matching circuit. The RF power source 31 is configured to supply at least one RF signal (RF power), such as a source RF signal and a bias RF signal, to the conductive member of the substrate support 11 and the antenna 14. As a result, plasma is formed from at least one processing gas supplied into the plasma processing space 10s. Accordingly, the RF power source 31 may function as at least a part of the plasma generator. Further, supplying the bias RF signal to the conductive member of the substrate support 11 can generate a bias potential in the substrate W to draw ions in the formed plasma to the substrate W.

In one embodiment, the RF power source 31 includes a first RF generator 31a and a second RF generator 31b. The first RF generator 31a is configured to be coupled to the antenna 14 through at least one impedance matching circuit so as to generate the source RF signal (source RF power) for plasma generation. In one embodiment, the source RF signal has a frequency in the range of 13 MHz to 150 MHz. In one embodiment, the first RF generator 31a may be configured to generate a plurality of source RF signals having different frequencies. The generated one or more source RF signals are supplied to the antenna 14. The second RF generator 31b is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31b may be configured to generate a plurality of bias RF signals having different frequencies. The generated one or more bias RF signals are supplied to the first bias electrode 33 and the second bias electrode 34 through the base 111c of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a bias DC generator 32a. In one embodiment, the bias DC generator 32a is connected to the conductive member of the substrate support 11 and configured to generate the bias DC signal. The generated bias DC signal is applied to the first bias electrode 33 and the second bias electrode 34 through the base 111c of the substrate support 11. In one embodiment, the bias DC signal may be applied to the base 111c.

In various embodiments, the bias DC signal may be pulsed. In this case, a sequence of voltage pulses is applied to at least one bias electrode. The voltage pulse may have a pulse waveform of a rectangle, a trapezoid, a triangle or a combination thereof. In one embodiment, a waveform generator for generating the sequence of voltage pulses from the DC signal is connected between the bias DC generator 32a and at least one bias electrode. Accordingly, the bias DC generator 32a and the waveform generator configure a voltage pulse generator. The voltage pulse may have a positive polarity or a negative polarity. Further, the sequence of the voltage pulses may include one or more positive voltage pulses and one or more negative voltage pulses in one cycle. The bias DC generator 32a may be provided in addition to the RF power source 31, or may be provided instead of the second RF generator 31b.

The antenna 14 includes one or more coils. In one embodiment, the antenna 14 may include an outer coil and an inner coil that are coaxially disposed. In this case, the RF power source 31 may be connected to both the outer coil and the inner coil, or may be connected to any one of the outer coil and the inner coil. In the former case, the same RF generator may be connected to both the outer coil and the inner coil, or separate RF generators may be connected to the outer coil and the inner coil, respectively.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

[Potential on Substrate Support 11]

Figure 2:
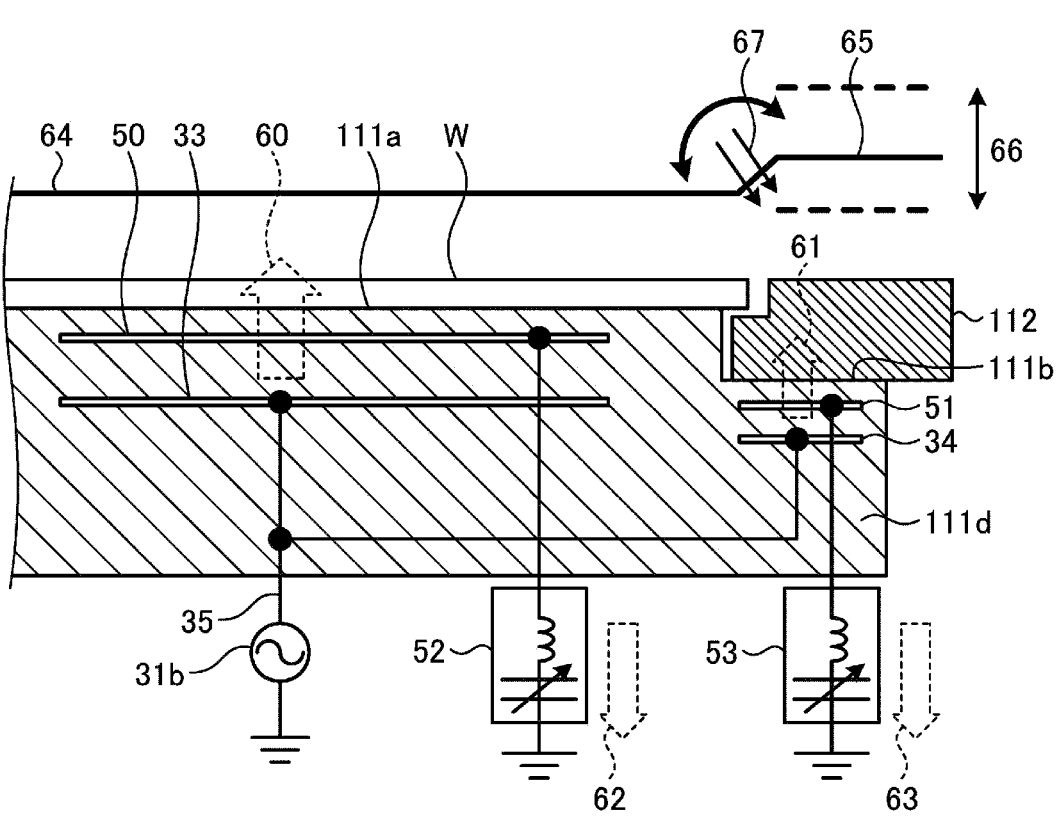
FIG. 2 is a view illustrating an example of a configuration of an electrode according to the present embodiment.

Next, the potential on the substrate support 11 will be described with reference to FIG. 2. FIG. 2 is a view illustrating an example of a configuration of an electrode according to the present embodiment. In FIG. 2, the bias RF signal is supplied from the second RF generator 31b to the first bias electrode 33 and the second bias electrode 34 through the electric path 35 formed by the base 111c and the conductive member.

As shown in FIG. 2, on the substrate support surface 111a, the bias RF signal supplied from the first bias electrode 33 disposed on the lower portion of the substrate support surface 111a is divided into an RF signal 60 supplied to plasma through the first impedance adjusting electrode 50 and the substrate W, and an RF signal 62 flowing from the first impedance adjusting electrode 50 to the ground through the impedance adjusting mechanism 52. Further, on the ring support surface 111b, the bias RF signal supplied from the second bias electrode 34 disposed on the lower portion of the ring support surface 111b is divided into an RF signal 61 supplied to the plasma through the second impedance adjusting electrode 51 and the ring assembly 112, and an RF signal 63 flowing from the second impedance adjusting electrode 51 to the ground through the impedance adjusting mechanism 53.

At this time, it is assumed that a potential 64, which is a line that images a predetermined potential on the upper portion of the substrate W, and a potential 65, which is a line that images a predetermined potential on the upper portion of the ring assembly 112, have different heights, for example, as shown in FIG. 2. In this case, the height of the potential 65 is adjusted in a range 66, for example, by adjusting the impedance adjusting mechanism 53. Accordingly, the tilting angle corresponding to a direction 67 of the electric field can be controlled by a ratio of the potential 64 to the potential 65. In FIG. 2, the angle of the direction 67 of the electric field is emphasized for the sake of description. Further, in the present embodiment, since the first impedance adjusting electrode 50 and the second impedance adjusting electrode 51 are embedded in the electrostatic chuck 111d, the structure of the plasma processing apparatus 1 can be made compact.

Figure 3:
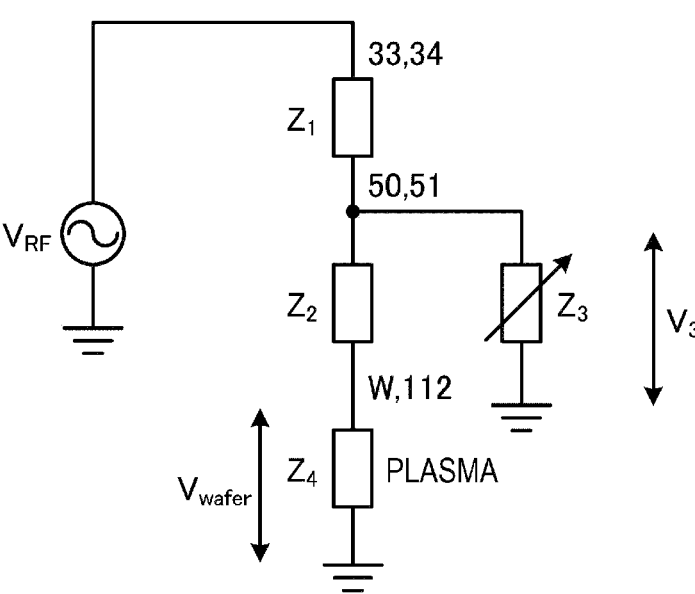
FIG. 3 is a view illustrating an example of an equivalent circuit of an electrostatic chuck and a plasma according to the present embodiment.

Next, an equivalent circuit of a circuit through which the bias RF signal flows will be described with reference to FIG. 3. FIG. 3 is a view illustrating an example of an equivalent circuit of an electrostatic chuck and a plasma according to the present embodiment. In FIG. 3, the bias RF signal supplied to the first bias electrode 33 and the second bias electrode 34 is represented by $V_{RF}$. Further, the impedance between the first bias electrode 33 and the second bias electrode 34, and the first impedance adjusting electrode 50 and the second impedance adjusting electrode 51 is represented by $Z_1$. Further, the impedance between the first impedance adjusting electrode 50 and the second impedance adjusting electrode 51, and the substrate W and the ring assembly 112 is represented by $Z_2$, and the impedance of the impedance adjusting mechanisms 52 and 53 between the first impedance adjusting electrode 50 and the second impedance adjusting electrode 51, and the ground is represented by $Z_3$. Further, the impedance of the plasma between the substrate W and the ring assembly 112, and the ground is represented by $Z_4$.

Here, a voltage $V_3$ applied to $Z_3$ and a voltage $V_{wafer}$ applied to $Z_4$ can be represented by Equations (1) and (2), respectively. In Expressions (1) to (4), $V_{RF}$ is represented by V.

[Equation 1]

$$V_3 = \frac{Z_3}{Z_1 + Z_2} V \qquad (1)$$

[Equation 2]

$$V_{wafer} = \frac{Z_4}{Z_2 + Z_4} V_3 \qquad (2)$$

Substituting Equation (1) into Equation (2), the voltage $V_{wafer}$ applied to $Z_4$ can be expressed by Equation (3) below. Further, when fractional terms of Equation (3) is divided by $Z_4$ and $Z_3$, respectively, Equation (4) below is obtained.

[Equation 3]

$$V_{wafer} = \frac{Z_4}{Z_2 + Z_4} \frac{Z_3}{Z_1 + Z_3} V \qquad (3)$$

[Equation 4]

$$V_{wafer} = \frac{1}{\frac{Z_2}{Z_4} + 1} \frac{1}{\frac{Z_1}{Z_3} + 1} V \qquad (4)$$

The fractional terms in Equation (4) are in the form of $f(x)=1/(x+1)$, and $f(x)$ is a function that approaches 1 as x is reduced. Therefore, according to Equation (4), the smaller $Z_2$ is with respect to $Z_4$, the more efficiently the potential is transmitted to the plasma. Further, the smaller $Z_1$ is with respect to $Z_3$, the more efficiently the potential is transmitted to the plasma. In order to reduce $Z_2$, it is preferable to make the first impedance adjusting electrode 50 and the second impedance adjusting electrode 51 as close as possible to the substrate W and the ring assembly 112. Similarly, in order to reduce the $Z_1$, it is preferable to make the first bias electrode 33 and the second bias electrode 34 as close as possible to the first impedance adjusting electrode 50 and the second impedance adjusting electrode 51. In this way, in a case where the first bias electrode 33 and the second bias electrode 34, the first impedance adjusting electrode 50 and the second impedance adjusting electrode 51, and the substrate W and the ring assembly 112 are made as close as possible, the sensitivity of the potential control can be increased.

[Potential Control Method]

According to the equivalent circuit shown in FIG. 3, the potential control method in the plasma processing apparatus 1 controls the potential of the first impedance adjusting electrode 50 by controlling the impedance $Z_3$ of the impedance adjusting mechanism 52 such that the impedance $Z_3$ between the first impedance adjusting electrode 50 and the ground becomes larger than the impedance $Z_1$ between the first bias electrode 33 and the first impedance adjusting electrode 50.

Further, the potential control method in the plasma processing apparatus 1 controls the potential of the second impedance adjusting electrode 51 by controlling the impedance $Z_3$ of the impedance adjusting mechanism 53 such that the impedance $Z_3$ between the second impedance adjusting electrode 51 and the ground becomes larger than the impedance $Z_1$ between the second bias electrode 34 and the second impedance adjusting electrode 51.

[Circuit Configuration of Impedance Adjusting Mechanism]

Figure 4:
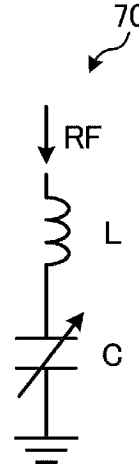
FIG. 4 is a view illustrating an example of a circuit configuration of an impedance adjusting mechanism according to the present embodiment.
Figure 4:
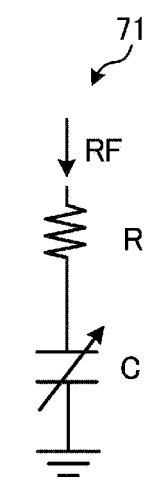
Figure 4:
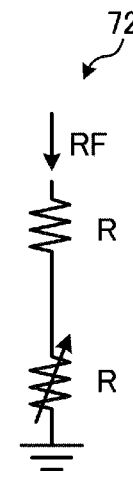
Figure 4:
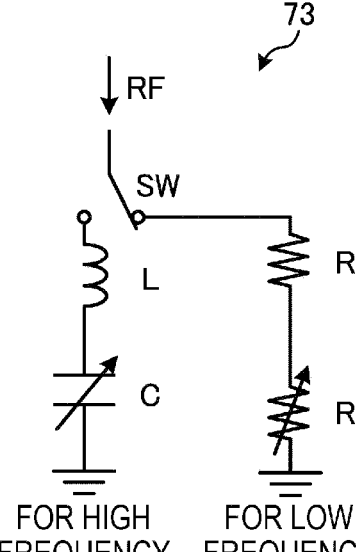
Figure 4:
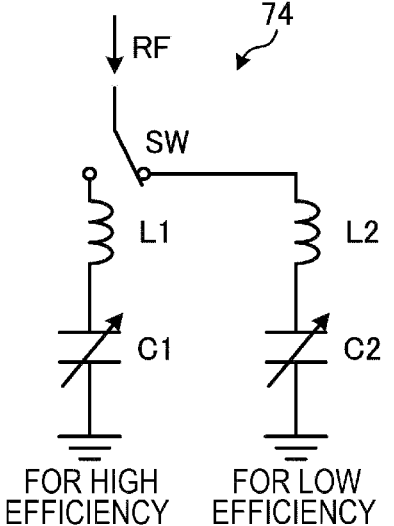
Figure 4:
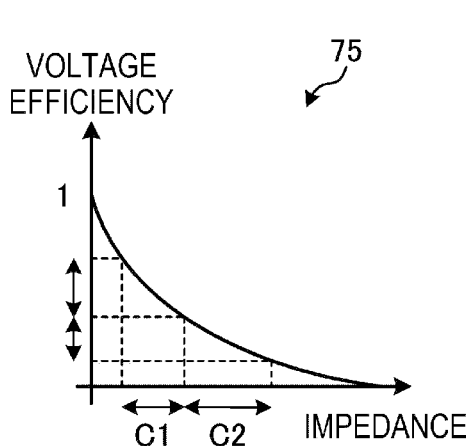

Next, variations in the circuit configurations of the impedance adjusting mechanisms 52 and 53 will be described with reference to FIG. 4. FIG. 4 is a view illustrating an example of a circuit configuration of an impedance adjusting mechanism according to the present embodiment. As shown in FIG. 4, the impedance adjusting mechanisms 52 and 53 may have various configurations like circuits 70 to 74. The circuit 70 is an LC series circuit using an inductor and a variable capacitor. The circuit 71 is an RC series circuit using a resistor and a variable capacitor. The circuit 72 is an RR series circuit using a resistor and a variable resistor. The circuit 73 is a circuit in which an LC series circuit for high frequency and an RR series circuit for low frequency can be switched by a switch SW. The circuit 74 is a circuit in which an LC series circuit for high efficiency and an LC series circuit for low efficiency can be switched by the switch SW. The circuit 74 is configured to widen an adjustment range by switching the switch SW as shown in a graph 75. Although not illustrated in FIG. 4, the impedance adjusting mechanisms 52 and 53 may have a circuit configuration using variable inductors.

In this way, a variable resistor, a variable capacitor, a variable inductor, and the like can be used for the impedance adjusting mechanisms 52 and 53, regardless of the type (R, L, or C) of a circuit constant to be adjusted. Further, the impedance adjusting mechanisms 52 and 53 may combine one or more variable mechanisms (the variable resistor, the variable capacitor, the variable inductor, and the like) according to the frequency of the bias RF signal, a size of parts, and an adjustment range. Variable resistors and variable capacitors can be used for the impedance adjusting mechanisms 52 and 53 because it is not necessary to pass a heater current through themselves. The impedance adjusting mechanisms 52 and 53 may be configured by at least one of the variable resistor, the variable capacitor, the variable inductor, and the direct-current power supply. For example, in a case where the bias RF signal is a radio-frequency signal, $Z_1$ and $Z_2$ described above become small values, and thus the potential can be controlled more effectively by controlling the potential using the direct-current power supply.

[Test Results]

Figure 5:
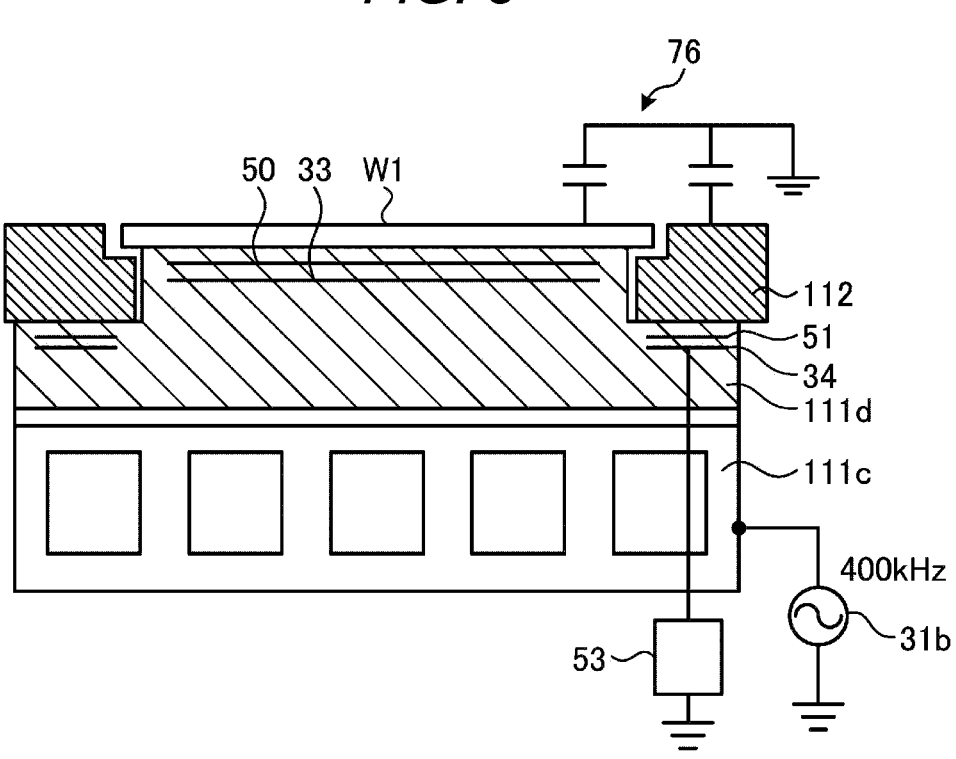
FIG. 5 is a view illustrating an example of a test result of potential control of an edge ring.
Figure 5:
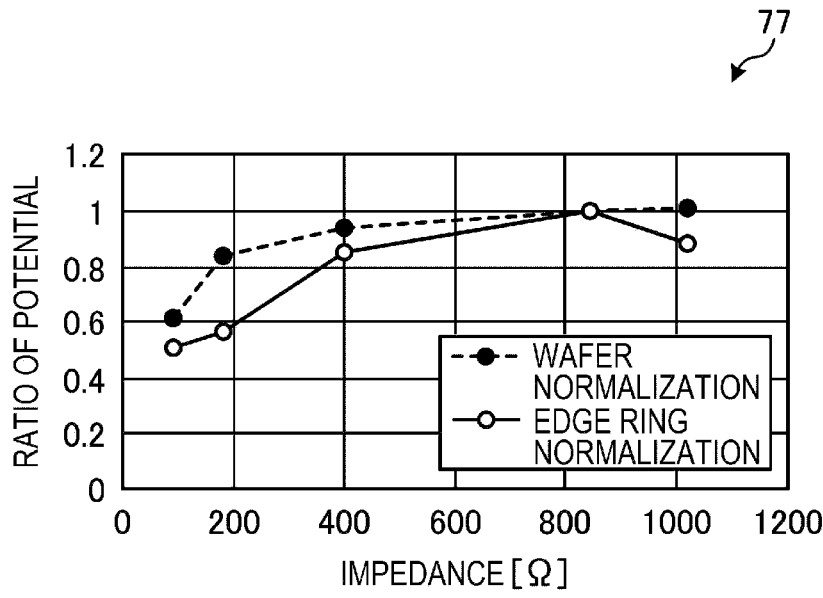
Figure 6:
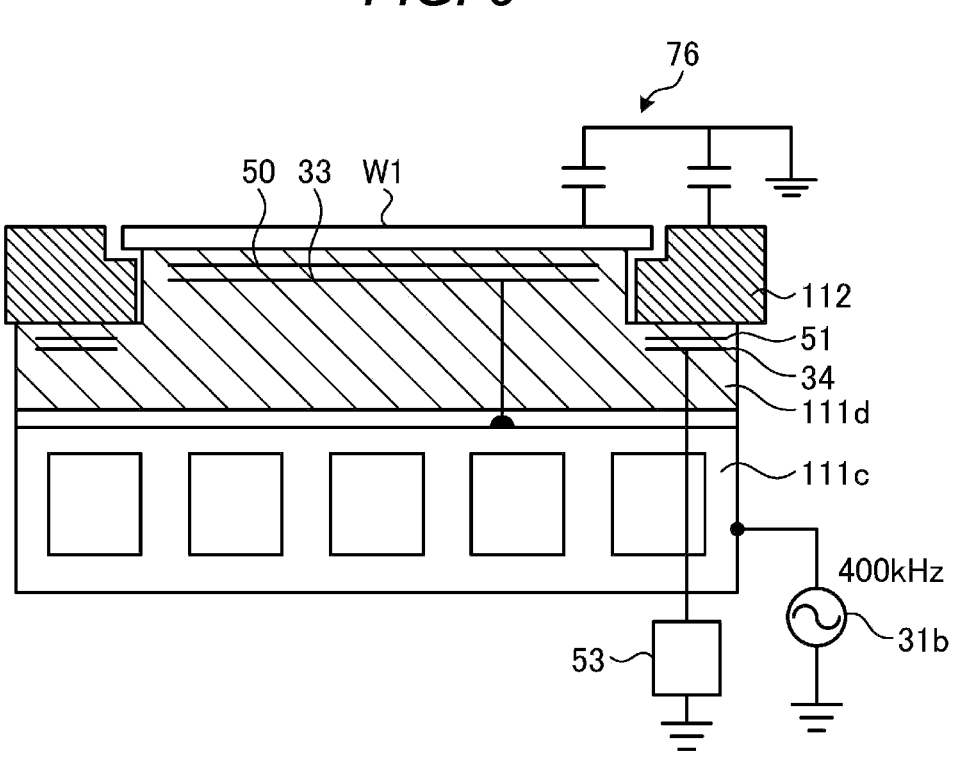
FIG. 6 is a view illustrating an example of the test result of the potential control of the edge ring.
Figure 6:
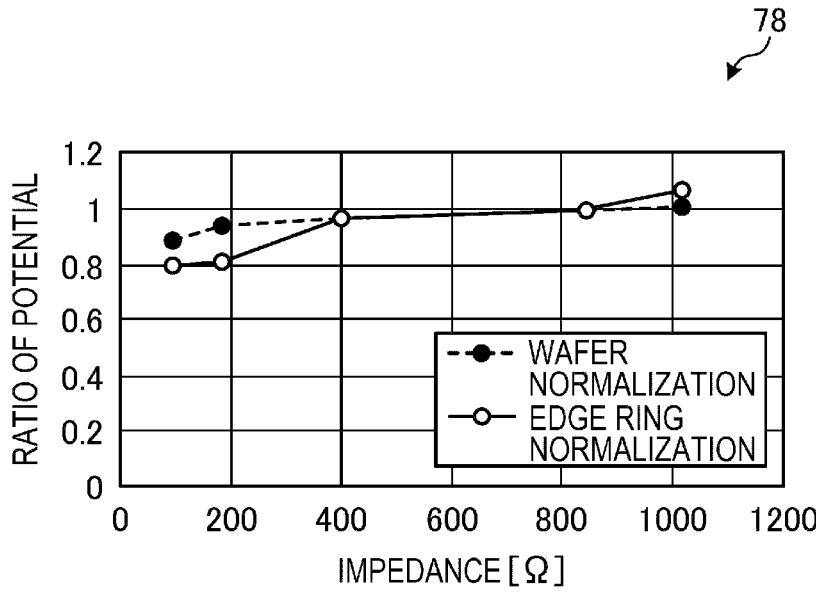
Figure 7:
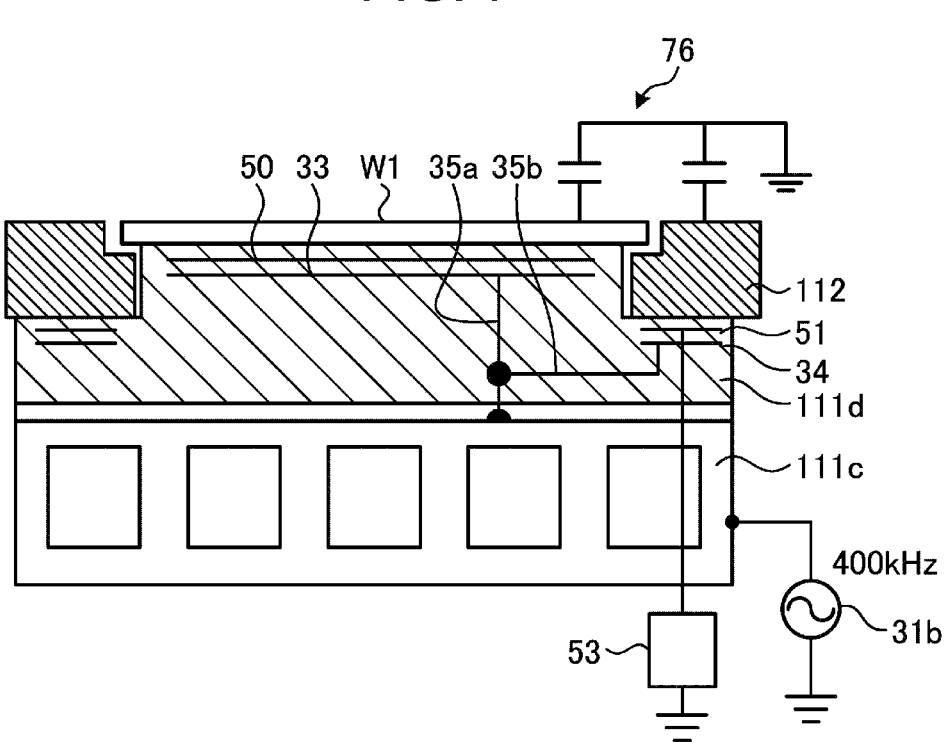
FIG. 7 is a view illustrating an example of the test result of the potential control of the edge ring.
Figure 7:
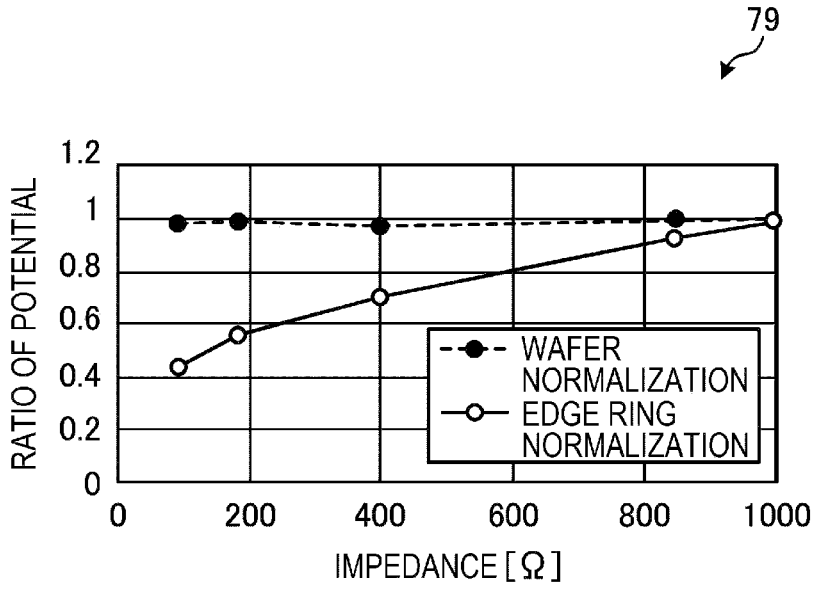

Next, with reference to FIGS. 5 to 7, test results will be described with respect to the relationship between the presence or absence of the supply of the bias RF signal to the first bias electrode 33 and the second bias electrode 34 and the possibility of the potential control by the impedance adjusting mechanism 53 on the ring assembly 112 (edge ring) side. FIGS. 5 to 7 are views showing examples of the test results of the potential control of the edge ring. In FIGS. 5 to 7, tests were performed by placing, instead of the substrate W, a substrate W1 made of a conductive member (for example, aluminum) on the substrate support surface 111a, and connecting a capacitor 76 for simulating plasma to the substrate W1 and the ring assembly 112. Further, graphs 77 to 79 represent a ratio of the potentials of the substrate W1 and the ring assembly 112 when the impedance of the impedance adjusting mechanism 53 was changed from about 100Ω to about 1000Ω to the potentials of the base 111c when being normalized, respectively. In the graphs 77 to 79, graphs obtained when being normalized by the substrate W1 are represented by wafer normalization, and graphs obtained when being normalized by the ring assembly 112 are represented by edge ring normalization.

FIG. 5 is a reference example and represents a case where the bias RF signal supplied from the second RF generator 31*b* is supplied to the base 111*c* and is not supplied to the first bias electrode 33 and the second bias electrode 34. In the example of FIG. 5, the test was performed by connecting the impedance adjusting mechanism 53 to the second bias electrode 34. In the case of the reference example of FIG. 5, as shown in the graph 77 (graph of the edge ring normalization), the ratio of the potential of ring assembly 112 does not follow the change in the impedance of the impedance adjusting mechanism 53, and thus it cannot be said that the potential of the ring assembly 112 is well controlled.

FIG. 6 is a reference example and represents a case where the first bias electrode 33 is connected to the base 111*c*, and the bias RF signal supplied from the second RF generator 31*b* is supplied to the first bias electrode 33. Further, the bias RF signal is not supplied to the second bias electrode 34. In the example of FIG. 6, the test was performed by connecting the impedance adjusting mechanism 53 to the second bias electrode 34. In the case of the reference example of FIG. 6, as shown in the graph 78 (graph of the edge ring normalization), the ratio of the potential of the ring assembly 112 does not follow the change in the impedance of the impedance adjusting mechanism 53, and thus it cannot be said that the potential of the ring assembly 112 is well controlled.

FIG. 7 is a reference example and represents a case where the first bias electrode 33 and the second bias electrode 34 are connected to the base 111*c* and the bias RF signal supplied from the second RF generator 31*b* is supplied to the first bias electrode 33 and the second bias electrode 34. In the example of FIG. 7, the test was performed by connecting the impedance adjusting mechanism 53 to the second impedance adjusting electrode 51. In the case of the reference example of FIG. 7, as shown in the graph 79 (graph of the edge ring normalization), the ratio of the potential of the ring assembly 112 follows the change in the impedance of the impedance adjusting mechanism 53, so that the potential of the ring assembly 112 is well controlled. Further, in the reference example of FIG. 7, the potential of the ring assembly 112 was abled to be changed by about 60%. According to the test results of FIGS. 5 to 7, the potential of the ring assembly 112 can be independently controlled by the combination of the first bias electrode 33, the second bias electrode 34, and the second impedance adjusting electrode 51. That is, the tilting control can be performed by controlling the potential of the ring assembly 112 independently. (Modification 1)

In the embodiment described above, an attracting electrode (not illustrated) is separately provided. However, the first impedance adjusting electrode 50 and the second impedance adjusting electrode 51 may be used as attracting electrodes, and the embodiment in this case will be described as Modification 1. Since some of the configurations of a plasma processing apparatus 1 according to Modification 1 are the same as in the above-described embodiment, the descriptions of the overlapping configurations and operations thereof will be omitted.

Figure 8:
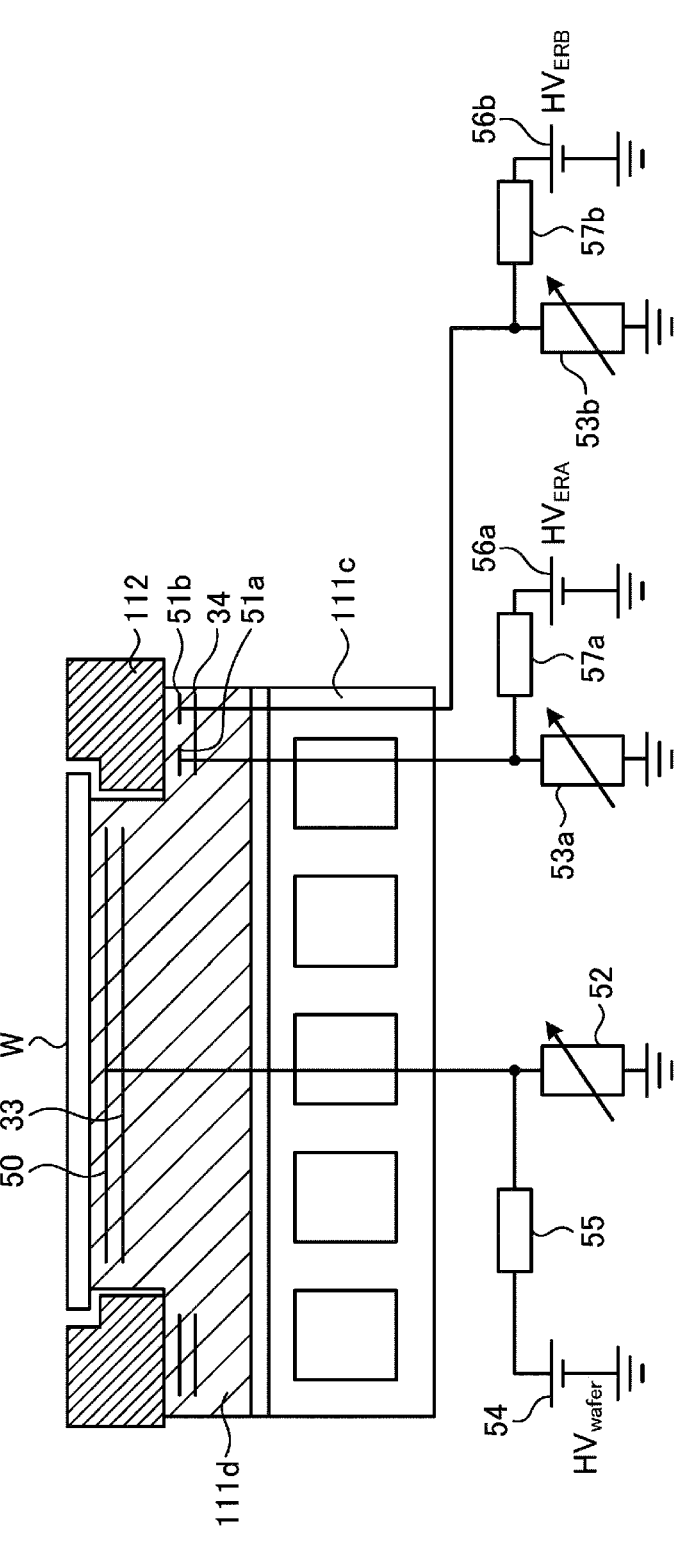
FIG. 8 is a view illustrating an example of the connection of the impedance adjusting mechanism according to Modification 1.

FIG. 8 is a view illustrating an example of the connection of the impedance adjusting mechanism according to Modification 1. In Modification 1 shown in FIG. 8, instead of the second impedance adjusting electrode 51, a plurality of second impedance adjusting electrodes 51*a* and 51*b* are provided. Further, in Modification 1, a direct-current power supply 54 for electrostatic attraction is connected to the first impedance adjusting electrode 50, and direct-current power supplies 56*a* and 56*b* for electrostatic attraction are connected to the second impedance adjusting electrodes 51*a* and 51*b*, respectively.

The direct-current power supply 54 is connected to a circuit that connects the first impedance adjusting electrode 50 and the impedance adjusting mechanism 52 through a low-pass filter 55. In a case where the direct-current power supply 54 applies a direct-current high voltage $HV_{wafer}$ to the first impedance adjusting electrode 50, the substrate W is attracted to the electrostatic chuck 111*d*. Similarly, the direct-current power supplies 56*a* and 56*b* are connected to circuits that connect the second impedance adjusting electrodes 51*a* and 51*b* to the impedance adjusting mechanisms 53*a* and 53*b*, respectively, through low-pass filters 57*a* and 57*b*. In a case where the direct-current power supplies 56*a* and 56*b* apply direct-current high voltages $HV_{ERA}$ and $HV_{ERB}$ to the second impedance adjusting electrodes 51*a* and 51*b*, respectively, the ring assembly 112 is attracted to the electrostatic chuck 111*d*.

The potential of the substrate W can be controlled in the same manner as in the above-described embodiment by adjusting the impedance adjusting mechanism 52. Further, the potential of the ring assembly 112 can be controlled in the same manner as in the above-described embodiment by adjusting the impedance adjusting mechanisms 53*a* and 53*b*. The impedance adjusting mechanisms 53*a* and 53*b* can control the potentials on the inner peripheral side and the outer peripheral side of the ring assembly 112, respectively, by performing controls independently of each other. (Modification 2)

In the embodiment described above, one first impedance adjusting electrode 50 is provided. However, the substrate support surface 111*a* may be divided into a plurality of regions, for example, in a concentric circle shape and in a circumferential direction, and respective impedance adjusting electrodes corresponding to the regions may be provided. The embodiment in this case will be described as Modification 2. Since some of the configurations of a plasma processing apparatus 1 according to Modification 2 are the same as in the above-described embodiment, the descriptions of the overlapping configurations and operations thereof will be omitted.

Figure 9:
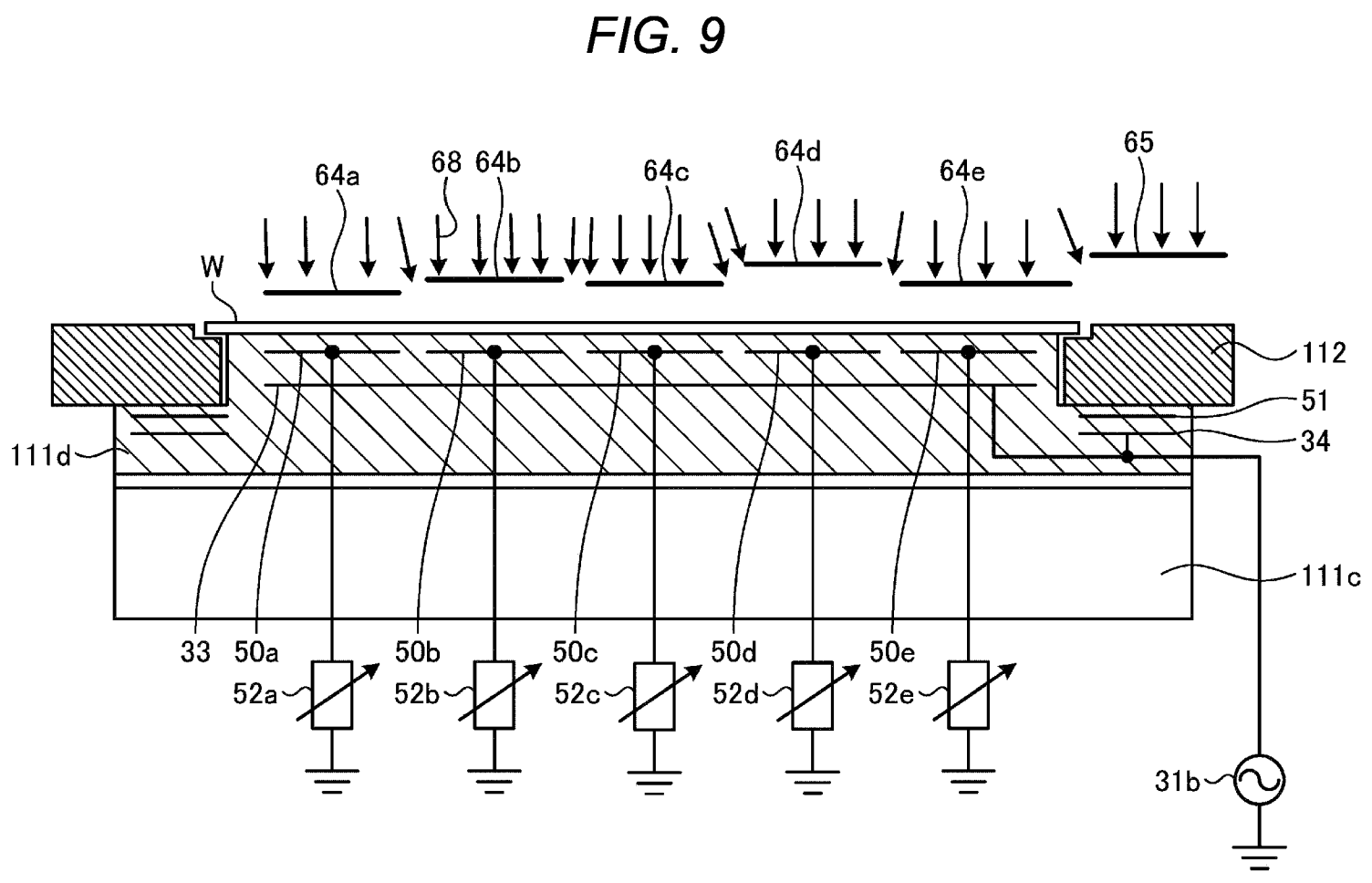

FIG. 9 is a view illustrating an example of the connection of the impedance adjusting mechanism according to Modification 2. In Modification 2 shown in FIG. 9, instead of the first impedance adjusting electrode 50, a plurality of first impedance adjusting electrodes 50*a* to 50*e* are provided. Further, in Modification 2, instead of the impedance adjusting mechanism 52, impedance adjusting mechanisms 52*a* to 52*e* corresponding to the plurality of first impedance adjusting electrodes 50*a* to 50*e*, respectively, are provided. In Modification 2, the impedance adjusting mechanism 53 connected to the second impedance adjusting electrode 51 is omitted.

The first impedance adjusting electrode 50*c* is provided, for example, on the lower portion of a circular region that includes the center of the substrate support surface 111*a*. The first impedance adjusting electrodes 50*b* and 50*d* are respectively provided on the lower portions of some areas of a concentric circle that surrounds the first impedance adjusting electrode 50*c*. The first impedance adjusting electrodes 50*a* and 50*e* are respectively provided on the lower portions of some areas of a concentric circle that surrounds the first impedance adjusting electrodes 50*b* and 50*d*.

Potentials 64a to 64e, which are lines that image the predetermined potential on the upper portion of the substrate W, can be independently controlled by controlling the impedance adjusting mechanisms 52a to 52e, respectively. In other words, the tilting angle corresponding to a direction 68 of the electric field can be controlled over the entire substrate W. The potential 65, which is a line that images the predetermined potential on the upper portion of the ring assembly 112, can be adjusted by the impedance adjusting mechanism 53, as in the above-described embodiment. In Modification 2, even for a film having no temperature sensitivity, the etching rate can be finely adjusted by controlling the potentials 64a to 64e on the substrate W. That is, this configuration works as an adjusting knob other than temperature. Further, since the potential can be adjusted in a plurality of regions of the substrate support surface 111a, the global tilting on the substrate W can be improved.

Further, in the embodiment described above, the case where the bias RF signal is supplied from the second RF generator 31b as the electric bias is described. However, the present disclosure is not limited thereto. For example, the bias DC signal may be supplied from the bias DC generator 32a as the electric bias. In this case, for example, the electric path 35 includes a first electric path that connects the second RF generator 31b, which is the first bias power supply, and at least one of the first bias electrode 33 and the second bias electrode 34. Further, for example, the electric path 35 includes a second electric path that connects the bias DC generator 32a that is the second bias power supply, and at least one of the first bias electrode 33 and the second bias electrode 34. Accordingly, any of the bias RF signal and the bias DC signal can be supplied to the first bias electrode 33 and the second bias electrode 34.

As described above, according to the present embodiment, the plasma processing apparatus 1 includes: the chamber (the plasma processing chamber 10); the bias power supply (the second RF generator 31b and the bias DC generator 32a) configured to generate an electric bias; the substrate support (the substrate support 11) configured to support the substrate W and the edge ring (the ring assembly 112) in the chamber, and including the first region (the central region 111a) provided to hold the substrate W, the second region (the annular region 111b) provided to surround the first region and configured to hold the edge ring, the first bias electrode 33 provided in the first region to receive the electric bias, the first impedance adjusting electrode 50 provided in the first region to be grounded, the second bias electrode 34 provided in the second region to receive the electric bias, and the second impedance adjusting electrode 51 provided in the second region to be grounded; the impedance adjusting mechanisms 52 and 53 connected to at least one of the first impedance adjusting electrode 50 and the second impedance adjusting electrode 51; and the electric path 35 connecting the bias power supply, the first bias electrode 33, and the second bias electrode 34. As a result, the potentials on the substrate W side and the edge ring side can be controlled independently.

Further, according to the present embodiment, the first bias electrode 33 and the first impedance adjusting electrode 50 are disposed to be parallel to each other. As a result, the potential on the substrate W can be controlled.

Further, according to the present embodiment, the second bias electrode 34 and the second impedance adjusting electrode 51 are disposed to be parallel to each other. As a result, the potential on the edge ring (the ring assembly 112) can be controlled.

Further, according to the present embodiment, the first impedance adjusting electrode 50 is disposed closer to a surface side that holds the substrate W than the first bias electrode 33. As a result, the potential on the substrate W can be controlled.

Further, according to the present embodiment, the second impedance adjusting electrode 51 is disposed closer to the surface side that holds the edge ring than the second bias electrode 34. As a result, the potential on the edge ring can be controlled.

Further, according to the present embodiment, the electric bias is a radio frequency. As a result, the potentials on the substrate W side and the edge ring side can be controlled independently.

Further, according to the present embodiment, the electric bias is a pulse wave. As a result, the potentials on the substrate W side and the edge ring side can be controlled independently.

Further, according to the present embodiment, the impedance adjusting mechanisms 52 and 53 are configured by at least one of a variable resistor, a variable capacitor, and a variable inductor. As a result, the potentials on the substrate W and the edge ring can be controlled.

Further, according to the present embodiment, the impedance adjusting mechanisms 52 and 53 are configured by at least one of a variable resistor, a variable capacitor, a variable inductor, and a direct-current power supply. As a result, the potentials on the substrate W and the edge ring can be controlled.

Further, according to the present embodiment, when the impedance adjusting mechanisms 52 and 53 are not connected, the first impedance adjusting electrode 50 and the second impedance adjusting electrode 51 are grounded or not grounded through impedance of a predetermined value. As a result, the potential on the substrate W or the edge ring can be controlled to a predetermined value.

Further, according to the present embodiment, the first impedance adjusting electrode 50 and the second impedance adjusting electrode 51 also function as attracting electrodes for electrostatically attracting the substrate W and the edge ring to the first region and the second region, respectively. As a result, the attracting electrode can be utilized as the impedance adjusting electrode.

Further, according to the present embodiment, at least one of the first impedance adjusting electrode 50 and the second impedance adjusting electrode 51 is divided into a plurality of regions, and impedance of each of the plurality of regions is independently adjustable. As a result, the potential can be controlled more finely.

Further, according to the present embodiment, in the electric path 35, the bias power supply is connected to the base 111c of the substrate support, and the first bias electrode 33 and the second bias electrode 34 are connected to the base 111c. As a result, the bias RF signal can be efficiently supplied, and the potential can be controlled.

Further, according to the present embodiment, the electric path 35 is configured such that the bias power supply is not connected to the base 111c of the substrate support, and that the bias power supply is directly connected to the first bias electrode 33 and the second bias electrode 34. As a result, the bias RF signal can be efficiently supplied, and the potential can be controlled.

Further, according to the present embodiment, in the electric path 35, the bias power supply is connected to the base 111c of the substrate support, and the base 111c is connected to the first bias electrode 33 and the second bias electrode 34 by magnetic field resonance, electric field resonance, capacitive coupling, or inductive coupling. As a result, the bias RF signal can be efficiently supplied, and the potential can be controlled.

Further, according to the present embodiment, the bias power supply (the second RF generator 31*b* and the bias DC generator 32*a*) includes at least a first bias power supply (second RF generator 31*b*) and a second bias power supply (bias DC generator 32*a*), and the electric path includes a first electric path that connects the first bias power supply to at least one of the first bias electrode 33 and the second bias electrode 34, and a second electric path that connects the second bias power supply to at least one of the first bias electrode 33 and the second bias electrode 34. As a result, the bias RF signal and the bias DC signal can be supplied, and the potential can be controlled.

Further, according to the present embodiment, there is provided a potential control method of the plasma processing apparatus 1, the plasma processing apparatus 1 including the chamber; the bias power supply configured to generate an electric bias; the substrate support configured to support the substrate W and the edge ring in the chamber, and including the first region configured to hold the substrate W, the second region provided to surround the first region and configured to hold the edge ring, the first bias electrode 33 provided in the first region to receive the electric bias, the first impedance adjusting electrode 50 provided in the first region to be grounded, the second bias electrode 34 provided in the second region to receive the electric bias, and the second impedance adjusting electrode 51 provided in the second region to be grounded; the impedance adjusting mechanisms 52 and 53 connected to at least one of the first impedance adjusting electrode 50 and the second impedance adjusting electrode 51; and the electric path 35 connecting the bias power supply, the first bias electrode 33, and the second bias electrode 34, the potential control method including a step of controlling a potential of at least one of the substrate W and the edge ring by controlling a potential of at least one of the first impedance adjusting electrode 50 and the second impedance adjusting electrode 51 by the impedance adjusting mechanisms 52 and 53. As a result, the potentials on the substrate W side and the edge ring side can be controlled independently.

Further, according to the present embodiment, the step of controlling the potential includes controlling the potential of the first impedance adjusting electrode 50 by controlling the impedance of the impedance adjusting mechanism 52 such that the impedance between the first impedance adjusting electrode 50 and the ground is larger than the impedance between the first bias electrode 33 and the first impedance adjusting electrode 50. As a result, the potential on the substrate W can be controlled.

Further, according to the present embodiment, the step of controlling the potential includes controlling the potential of the second impedance adjusting electrode 51 by controlling the impedance of the impedance adjusting mechanism 53 such that the impedance between the second impedance adjusting electrode 51 and the ground is larger than the impedance between the second bias electrode 34 and the second impedance adjusting electrode 51. As a result, the potential on the edge ring can be controlled.

The embodiments disclosed herein are exemplary in all respects and can be considered to be non-restrictive. The embodiments described above may be omitted, replaced, or modified in various forms without departing from the scope and spirit of the appended claims.

Further, in the embodiments described above, the plasma processing apparatus 1 in which processing such as etching is performed on the substrate W using inductively-coupled plasma as the plasma source has been described as an example. However, the technique disclosed herein is not limited thereto. As long as the apparatus performs a process on the substrate W by using plasma, the plasma source is not limited to the inductive coupling plasma, and any plasma source such as capacitive coupling plasma, microwave plasma, or magnetron plasma can be used.

The invention claimed is:

1. A plasma processing apparatus comprising:
   a chamber;
   a bias power supply configured to generate an electric bias;
   a substrate support to support a substrate and an edge ring in the chamber, the substrate support including:
   a first region to hold the substrate;
   a second region provided to surround the first region and to hold the edge ring;
   a first bias electrode provided in the first region to receive the electric bias;
   a first impedance adjusting electrode provided in the first region and grounded;
   a second bias electrode provided in the second region to receive the electric bias; and
   a second impedance adjusting electrode provided in the second region and grounded;
   impedance adjusting circuitry connected to at least one of the first impedance adjusting electrode and the second impedance adjusting electrode; and
   an electric path connecting the bias power supply, the first bias electrode, and the second bias electrode, and the electric path is such that the bias power supply is connected to a base of the substrate support, and that the first bias electrode and the second bias electrode are connected to the base.

2. The plasma processing apparatus according to claim 1, wherein the first bias electrode and the first impedance adjusting electrode are disposed to be parallel to each other.

3. The plasma processing apparatus according to claim 1, wherein the second bias electrode and the second impedance adjusting electrode are disposed to be parallel to each other.

4. The plasma processing apparatus according to claim 1, wherein the first impedance adjusting electrode is disposed closer to a surface side that holds the substrate than the first bias electrode.

5. The plasma processing apparatus according to claim 1, wherein the second impedance adjusting electrode is disposed closer to a surface side that holds the edge ring than the second bias electrode.

6. The plasma processing apparatus according to claim 1, wherein the electric bias is a radio frequency.

7. The plasma processing apparatus according to claim 1, wherein the electric bias is a pulse wave.

8. The plasma processing apparatus according to claim 1, wherein the impedance adjusting circuitry has at least one of a variable resistor, a variable capacitor, and a variable inductor.

9. The plasma processing apparatus according to claim 1, wherein the impedance adjusting circuitry has at least one of a variable resistor, a variable capacitor, a variable inductor, and a direct-current power supply.

10. The plasma processing apparatus according to claim 1, wherein the first impedance adjusting electrode and the second impedance adjusting electrode are grounded or not grounded through impedance of a predetermined value.

11. The plasma processing apparatus according to claim 1, wherein the first impedance adjusting electrode and the second impedance adjusting electrode also function as attracting electrodes for electrostatically attracting the substrate and the edge ring to the first region and the second region, respectively.

12. The plasma processing apparatus according to claim 1, wherein at least one of the first impedance adjusting electrode and the second impedance adjusting electrode is divided into a plurality of regions, and impedance of each of the plurality of regions is independently adjustable.

13. The plasma processing apparatus according to claim 1, wherein the bias power supply includes at least a first bias power supply and a second bias power supply, and the electric path includes a first electric path that connects the first bias power supply to at least one of the first bias electrode and the second bias electrode, and a second electric path that connects the second bias power supply to at least one of the first bias electrode and the second bias electrode.

14. The plasma processing apparatus according to claim 1, wherein the impedance adjusting circuitry has a variable resistor.

15. The plasma processing apparatus according to claim 1, wherein the impedance adjusting circuitry has a variable capacitor.

16. The plasma processing apparatus according to claim 1, wherein the impedance adjusting circuitry has a variable inductor.

17. The plasma processing apparatus according to claim 1, wherein the impedance adjusting circuitry has a direct-current power supply.

* * * * *